(12) United States Patent
Patra

(10) Patent No.: US 9,823,571 B2
(45) Date of Patent: Nov. 21, 2017

(54) EUV LIGHT SOURCE FOR A LIGHTING DEVICE OF A MICROLITHOGRAPHIC PROJECTION EXPOSURE APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 15/266,191

(22) Filed: Sep. 15, 2016

(65) Prior Publication Data

US 2017/0003597 A1  Jan. 5, 2017

Related U.S. Application Data

(63) Continuation of application No. PCT/EP2015/054175, filed on Feb. 27, 2015.

(30) Foreign Application Priority Data

Mar. 26, 2014  (DE) .................. 10 2014 205 579

(51) Int. Cl.
  *G03F 7/20* (2006.01)
  *G03B 27/42* (2006.01)
  (Continued)

(52) U.S. Cl.
  CPC ...... *G03F 7/70025* (2013.01); *G03F 7/70566* (2013.01); *H01S 3/0903* (2013.01);
  (Continued)

(58) Field of Classification Search
  CPC .... G03F 7/70025; G03F 7/70566; H01S 4/00; H01S 3/0903; H05H 7/04; H05G 2/00
  See application file for complete search history.

(56) References Cited

U.S. PATENT DOCUMENTS

| 5,714,850 A | 2/1998 | Kitamura et al. |
| 6,999,172 B2 | 2/2006 | Masaki et al. |

(Continued)

FOREIGN PATENT DOCUMENTS

| DE | 696 04 706 T2 | 4/2000 |
| DE | 103 58 225 B3 | 6/2005 |

(Continued)

OTHER PUBLICATIONS

P. Schmüser et al.: "Ultraviolet and Soft X-Ray Free-Electron Lasers: Introduction to Physical Principles, Experimental Results, Technological Challenges", STMP 229, Springer, Berlin Heidelberg 2008, Chapters 4-7 (51 pages).

(Continued)

*Primary Examiner* — Mesfin Asfaw
(74) *Attorney, Agent, or Firm* — Fish & Richardson P.C.

(57) ABSTRACT

An EUV light source for an illumination device of a microlithographic proj ection exposure apparatus, includes an electron source for generating an electron beam, an accelerator unit for accelerating the electron beam, and an undulator arrangement for generating EUV light by deflecting the electron beam. The undulator arrangement includes a first undulator for generating EUV light having a first polarization state and at least one second undulator for generating EUV light having a second polarization state different than the first polarization state. The second undulator is downstream of the first undulator along the direction of propagation of the electron beam. The undulator arrangement is configured so that it has a first operating mode, in which the first undulator is in saturation with regard to the generation of EUV light, and at least one second operating mode, in which the first undulator is not in saturation with regard to the generation of EUV light.

23 Claims, 8 Drawing Sheets

(51) Int. Cl.
*H01S 3/09* (2006.01)
*H05H 7/04* (2006.01)
*H05G 2/00* (2006.01)
*H01S 4/00* (2006.01)

(52) U.S. Cl.
CPC .............. *H01S 4/00* (2013.01); *H05G 2/00* (2013.01); *H05H 7/04* (2013.01)

(56) References Cited

U.S. PATENT DOCUMENTS

| | | |
|---|---|---|
| 2006/0158288 A1 | 7/2006 | Rossmanith et al. |
| 2007/0152171 A1 | 7/2007 | Goldstein |
| 2008/0192225 A1 | 8/2008 | Maim et al. |
| 2009/0213356 A1* | 8/2009 | Gruner .................. B82Y 10/00 355/71 |
| 2010/0045410 A1 | 2/2010 | Beckenbach et al. |
| 2015/0124233 A1 | 5/2015 | Patra |
| 2016/0195820 A1 | 7/2016 | Fiolka et al. |

FOREIGN PATENT DOCUMENTS

| | | |
|---|---|---|
| DE | 10 2006 039 655 A1 | 3/2008 |
| DE | 10 2006 056 052 A1 | 5/2008 |
| DE | 10 2008 002 749 A1 | 12/2009 |
| DE | 10 2012 214 063 A1 | 2/2014 |
| DE | 10 2013 205 957 A1 | 4/2014 |
| DE | 10 2013 211 830 A1 | 6/2014 |
| JP | S 63-226 899 A | 9/1988 |
| WO | WO 2006/111319 A2 | 10/2006 |

OTHER PUBLICATIONS

International Preliminary Report for Patentability for corresponding Appl. PCT/EP2015/054175, dated Sep. 27, 2016.

German Office Action, with translation thereof, for corresponding DE Appl No. 10 2014 205 579.2 dated Jan. 29, 2015.

International Search Report for corresponding PCT Appl No. PCT/EP2015/054175, dated Aug. 4, 2015.

Geng H et al., "Crossed undulator polarization control for X-ray FELs in the saturation regime", Nuclear Instruments & Methods in Physics Research, Section A (Accelerators, Spectrometers, Detectors and Associated Equipment) Elsevier Science B.V. Netherlands, vol. 622, No. 1, Oct. 2010. pp. 276-280.

Kwang-Je Kim, "Circular polarization with crossed-planar undulators in high-gain FELs", Nuclear Instruments & Methods in Physics Research, Section A (Accelerators, Spectrometers, Detectors and Associated Equipment) Elsevier Netherlands, vol. 445, No. 1-3, May 1, 2000, pp. 329-332.

Newnam B, "Extreme Ultraviolet Free-Electron Laser-Based Projection Lithography Systems", Optical Engineering, Soc. of Photo-Optical Instrumentation Engineers, Bellingham, WA, vol. 30, No. 8, Aug. 30, 1991, pp. 1100-1108.

Socol Y et al., "Compact 13.5-nm free-electron laser for extreme ultraviolet lithography", Phys. Rev. Spec. Top., 14:040702, Apr. 25, 2011.

* cited by examiner

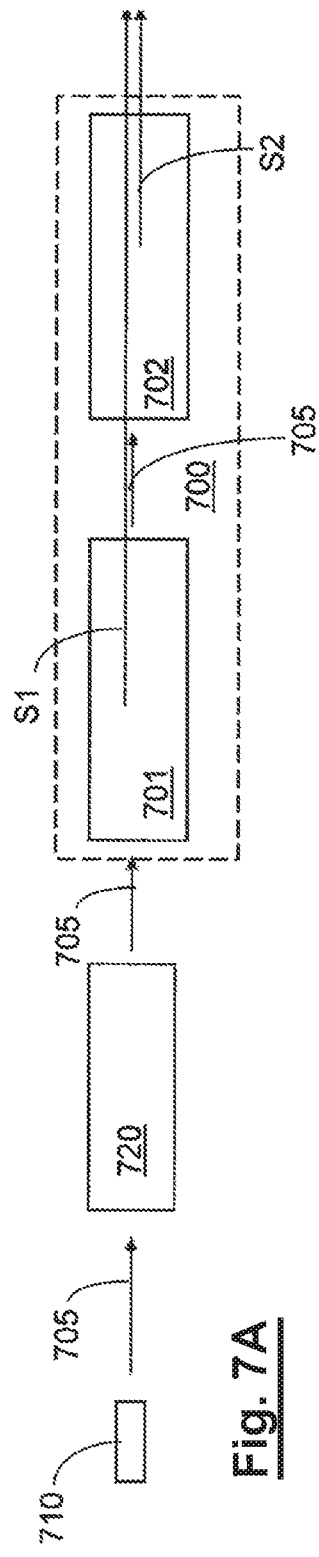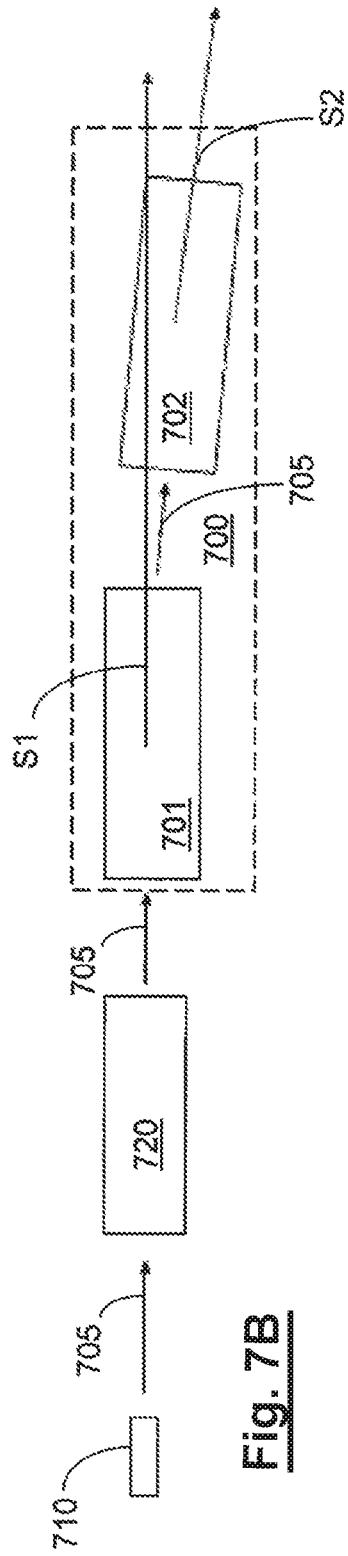

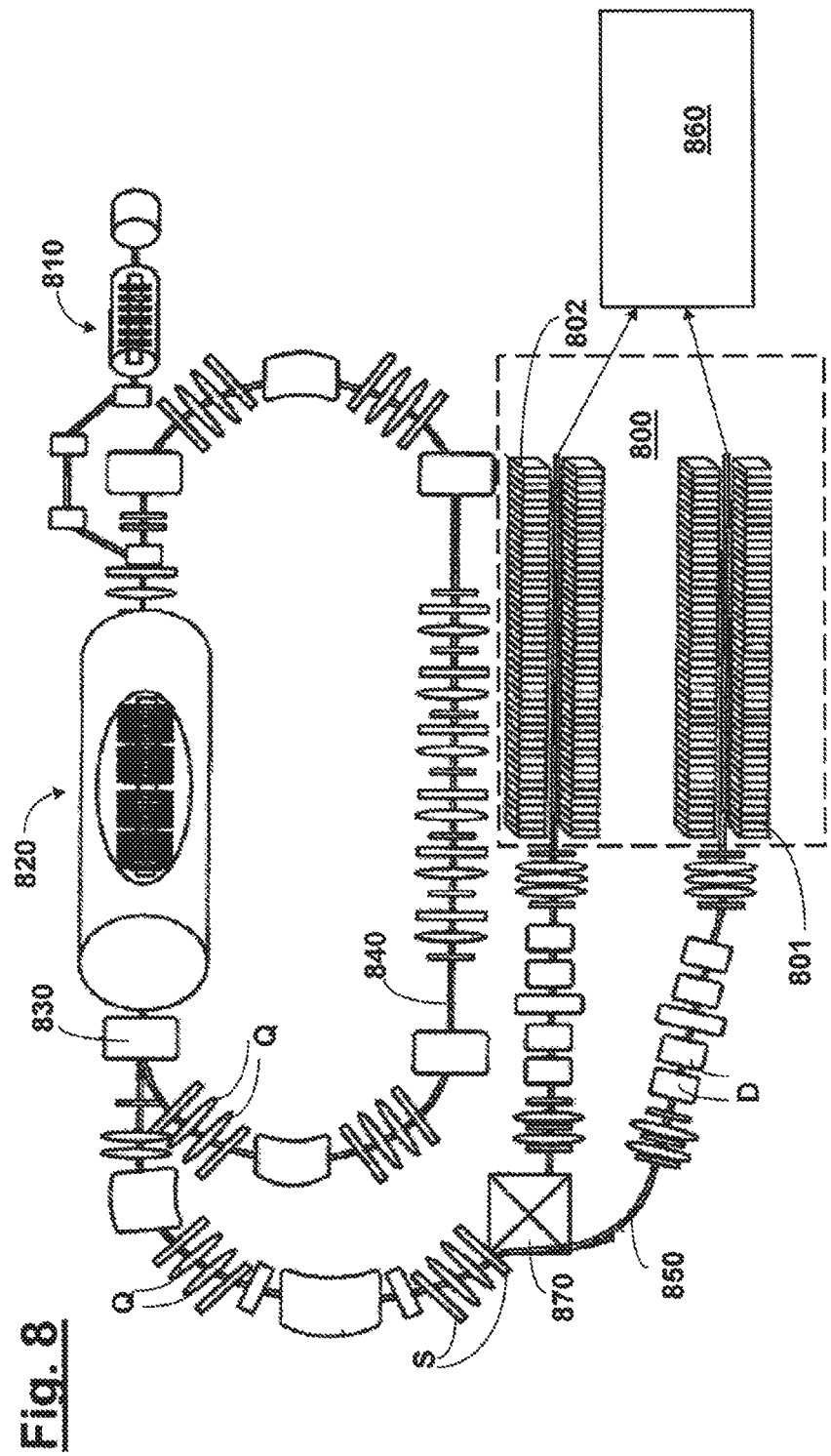

EUV LIGHT SOURCE FOR A LIGHTING DEVICE OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2015/054175, filed Feb. 27, 2015, which claims benefit under 35 USC 119 of German Application No. DE 10 2014 205 579.2, filed Mar. 26, 2014. The entire disclosure of international application PCT/EP2015/054175 and German Application No. 10 2014 205 579.2 are incorporated by reference herein.

FIELD

The disclosure relates to an EUV light source for an illumination device of a microlithographic projection exposure apparatus.

BACKGROUND

Microlithography is used for producing microstructured components, such as integrated circuits or LCDs, for example. The microlithography process is carried out in a so-called projection exposure apparatus having an illumination device and a projection lens. The image of a mask (reticle) illuminated via the illumination device is in this case projected via the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

As EUV radiation source the use of a free electron laser is known besides plasma sources and synchrotrons. The lasers have the advantage, inter alia, that the generated radiation is restricted to the desired EUV radiation, i.e. the desired wavelength range, and the contaminations that arise in the case of plasma sources owing to the target materials involved there are also avoided.

During the operation of a projection exposure apparatus it is desirable to set specific polarization distributions in the pupil plane and/or in the reticle in a targeted manner in the illumination device for the purpose of optimizing the imaging contrast and also to be able to carry out a change in the polarization distribution during the operation of the projection exposure apparatus.

In principle, in a free electron laser, polarized radiation is generated by the use of an undulator arrangement including a plurality of magnets for generating EUV light by deflecting the electron beam. FIG. 7A and 7B in each case show a possible construction of a free electron laser including an electron source 710 for generating an electron beam 705, an accelerator unit 720 for accelerating the electron beam 705, and an undulator arrangement 700 including a plurality of magnets for generating EUV light by deflecting the electron beam 705, wherein the undulator arrangement 700 here includes two undulators 701, 702. Since the polarization of the generated radiation is predefined by the concrete arrangement of the magnets of the undulator arrangement 700, in principle in accordance with FIGS. 7A,7B with the use of an undulator arrangement 700 including two undulators 701, 702 it is possible to generate light beams S1, S2 having mutually different polarization directions (e.g. horizontally and vertically polarized light), wherein as indicated in FIG. 7B it is also possible to realize a spatial separation of the respective beam paths e.g. by tilting the undulators 701, 702 in relation to one another (relative to the respective direction of propagation of the electron beam within the relevant undulator).

Even if the principle described above with reference to FIGS. 7A and 7B fundamentally allows the setting of different polarized illumination settings (including the generation of effectively polarized radiation upon the superimposition of horizontally and vertically polarized light), here in practice the problem occurs that, depending on the desired one of the polarized illumination settings the light of the undulator having the polarization state respectively not desired is not used or is lost, as a result of which the performance of the projection exposure apparatus is impaired.

With regard to publications regarding changing the polarization distribution in projection exposure apparatuses designed for the EUV range, merely by way of example reference is made to DE 10 2008 002 749 A1, US 2008/0192225 A1, WO 2006/111319 A2 and U.S. Pat. No. 6,999, 172 B2.

SUMMARY

The present disclosure seeks to provide an EUV light source for an illumination device of a microlithographic projection exposure apparatus which enables a flexible setting of the polarization distribution in the projection exposure apparatus in conjunction with comparatively little loss of light.

A light source for an illumination device of a microlithographic projection exposure apparatus includes an electron source for generating an electron beam, an accelerator unit for accelerating the electron beam, and an undulator arrangement for generating EUV light by deflecting the electron beam, wherein the undulator arrangement includes:

a first undulator for generating EUV light having a first polarization state; and at least one second undulator for generating EUV light having a second polarization state, wherein the second polarization state is different than the first polarization state, wherein the second undulator is arranged downstream of the first undulator along the direction of propagation of the electron beam, and wherein the undulator arrangement is configured in such a way that it has a first operating mode, in which the first undulator is in saturation with regard to the generation of EUV light, and at least one second operating mode, in which the first undulator is not in saturation with regard to the generation of EUV light.

The present disclosure involves the concept, in particular, of realizing the flexible setting of different desired polarized illumination settings by achieving a variation of the respective absolute values of the two undulators present in the undulator arrangement according to the disclosure with respect to the electromagnetic radiation generated overall, and thus a flexible setting of the polarization state ultimately generated.

By virtue of the fact that the first undulator along the direction of propagation of the electron beam is operated selectively either in saturation or else not in saturation, according to the disclosure it is possible at the same time to vary that proportion which the second undulator relative to the direction of propagation of the electron beam constitutes in the radiation released overall by the undulator arrangement. That is based on the consideration that in the case of occurrence of saturation in the first undulator the entire useable energy is already drawn from the electron beam in the first undulator with the consequence that upon passing through the second undulator the energy unsharpness of the electrons is already so great that laser action is no longer possible there. If, by contrast, in the case where saturation does not occur in the first undulator, the first undulator generates light or draws energy from the electron beam to a comparatively small extent, the laser action or light generation correspondingly takes place in the second undulator.

As a result, with constant use of the entire radiation energy or intensity released by the undulator arrangement according to the disclosure by way of the variation of the relative contributions of the two undulators to this total intensity, it is thus possible to achieve the flexible setting of the polarization distribution without significant loss of light.

In this case, a further advantage of the disclosure is that the concept according to the disclosure with the use of two undulators does not lead to a significant increase in the expenditure in respect of costs, since the major expenditure in respect of costs in a free electron laser is caused by the components for accelerating the electrons and the desired cooling of these components (and not by the undulator arrangement).

A further advantage of the disclosure is that—as explained in even greater detail below—a significant variation of the distribution of the energy emitted overall between the two undulators and thus of the polarization state ultimately provided can already be achieved with a comparatively small change in the so-called gain length or parameters relevant thereto.

Within the meaning of the present disclosure, the fact that an undulator is in saturation with regard to the generation of EUV light is preferably understood to mean that the intensity at the output of the relevant undulator is less than 1.1 times that intensity value which is achieved after a 90% pass through the relevant undulator (wherein an intensity at the output of the relevant undulator of not equal to zero is taken as a basis).

The undulator arrangement can include a plurality of magnets for generating EUV light. However, the disclosure is not restricted thereto, wherein in further embodiments the electromagnetic field of a laser can also be used, as known e.g. from US 2007/0152171 A1.

In accordance with one embodiment, the undulator arrangement is configured in such a way that in at least one operating mode a proportion of at least 90% of the generation of the EUV light is effected by the second undulator.

In accordance with one embodiment, the undulator arrangement is configured in such a way that in at least one operating mode a proportion of at least 90% of the generation of the EUV light is effected by the first undulator.

In accordance with one embodiment, the undulator arrangement is configured in such a way that in at least one operating mode a proportion of at least 40% of the generation of the EUV light is effected by the first undulator and a proportion of at least 40% of the generation is effected by the second undulator.

In accordance with one embodiment, the polarization state of the EUV light generated by the undulator arrangement is settable in a variable manner by the modification of the electron beam before the latter enters the undulator arrangement. In particular, the polarization state of the EUV light generated by the undulator arrangement can be settable in a variable manner by the modification of the gain length of the electron beam before the latter enters the undulator arrangement. By virtue of the fact that the polarization setting (or the variation of the relative contributions of the two undulators) is effected by the setting or modification of the electron beam before the latter enters the undulator arrangement, no actuation within the undulator arrangement itself is necessary, and so a structural outlay associated with such an actuation of the undulator arrangement is avoided.

In accordance with one embodiment, the EUV light source includes a plurality of quadrupole magnets for focusing the electron beam, to which magnets electric current can be applied, wherein the switching between the first operating mode and the second operating mode is effected at least partly by variation of the electric current in at least one of the quadrupole magnets.

In accordance with one embodiment, the first polarization state and the second polarization state are orthogonal with respect to one another.

In accordance with one embodiment, the undulator arrangement is further configured in such a way that a first light beam generated by the first undulator and a second light beam generated by the second undulator can be fed to the illumination device in a manner spatially separated from one another.

In accordance with one embodiment, the first undulator and the second undulator are arranged in such a way that the direction of propagation of the electron beam in the first undulator and the direction of propagation of the electron beam in the second undulator are tilted with respect to one another.

In accordance with one embodiment, the undulator arrangement is further configured in such a way that a first light beam generated by the first undulator and a second light beam generated by the second undulator can be superimposed on one another in the course of feeding to the illumination device.

The disclosure further relates to a microlithographic projection exposure apparatus including an illumination device and a projection lens, wherein the projection exposure apparatus includes an EUV light source having the above features.

In accordance with a further aspect, the disclosure relates to a microlithographic projection exposure apparatus including an EUV light source, an illumination device and a projection lens, wherein the EUV light source includes an electron source for generating an electron beam, an accelerator unit for accelerating the electron beam and an undulator arrangement for generating EUV light by deflecting the electron beam, wherein the undulator arrangement includes a first undulator for generating EUV light having a first polarization state and at least one second undulator for generating EUV light having a second polarization state, wherein the second polarization state is different than the first polarization state;

wherein during the operation of the projection exposure apparatus EUV light generated by the first undulator and EUV light generated by the second undulator are respectively coupled into the illumination device; and wherein the respective relative proportion in which the energy of the electron beam is converted into EUV light generated by the first undulator and respectively into EUV light generated by the second undulator is settable in a variable manner.

In this case, in particular the light energy of the EUV light generated respectively by the first and second undulators can be used for calculating the relative proportion.

In accordance with one embodiment, the variable setting of the respective relative proportion in which the energy of the electron beam is converted into EUV light generated by the first undulator and respectively into EUV light generated by the second undulator can be carried out by modification of the electron beam (e.g. by modification of the gain length) before the latter enters the undulator arrangement.

In accordance with a further aspect, the disclosure relates to a method for operating an EUV light source for an illumination device of a microlithographic projection exposure apparatus, wherein the EUV light source includes an electron source for generating an electron beam, an accelerator unit for accelerating the electron beam, and an undulator arrangement for generating EUV light by deflecting the electron beam, wherein the undulator arrangement includes:
  a first undulator for generating EUV light having a first polarization state; and at least one second undulator for generating EUV light having a second polarization state, wherein the second polarization state is different than the first polarization state;
  wherein the second undulator is arranged downstream of the first undulator along the direction of propagation of the electron beam; and
  wherein during the operation of the undulator arrangement switching is effected between a first operating mode, in which the first undulator is in saturation with regard to the generation of EUV light, and at least one second operating mode, in which the first undulator is not in saturation with regard to the generation of EUV light.

In accordance with one embodiment, the switching between the first operating mode and the second operating mode is effected by modification of the electron beam (e.g. by modification of the gain length) before the latter enters the undulator arrangement.

In accordance with a further aspect, the disclosure relates to a method for operating an EUV light source for an illumination device of a microlithographic projection exposure apparatus, wherein the EUV light source includes an electron source for generating an electron beam, an accelerator unit for accelerating the electron beam, and an undulator arrangement for generating EUV light by deflecting the electron beam,
  wherein the undulator arrangement includes a first undulator for generating EUV light having a first polarization state and at least one second undulator for generating EUV light having a second polarization state, wherein the second polarization state is different than the first polarization state;
  wherein during the operation of the projection exposure apparatus EUV light generated by the first undulator and EUV light generated by the second undulator are respectively coupled into the illumination device; and
  wherein the respective relative proportion in which the energy of the electron beam is converted into EUV light generated by the first undulator and respectively into EUV light generated by the second undulator is settable in a variable manner.

In accordance with one embodiment, the variable setting of the respective relative proportion in which the energy of the electron beam is converted into EUV light generated by the first undulator and respectively into EUV light generated by the second undulator is effected by modification of the electron beam before the latter enters the undulator arrangement.

In accordance with one embodiment, the EUV light source includes a plurality of quadrupole magnets for focusing the electron beam, to which magnets electric current can be applied, wherein the switching between the first operating mode and the second operating mode is effected at least partly by variation of the electric current in at least one of the quadrupole magnets.

In accordance with one embodiment, an approximate tangential polarization distribution or an approximately radial polarization distribution is generated in a pupil plane of the illumination device at least occasionally.

In accordance with one embodiment, unpolarized light is generated in a pupil plane of the illumination device at least occasionally.

The disclosure further also relates to a method for microlithographically producing microstructured components.

Further configurations of the disclosure can be gathered from the description and the dependent claims.

BRIEF DESCRIPTION OF THE DRAWINGS

The disclosure is explained in greater detail below on the basis of exemplary embodiments illustrated in the accompanying figures, in which:

FIGS. 7A-7B show schematic illustrations for elucidating the possible construction of a free electron laser; and FIG. 8 shows a schematic illustration for elucidating the possible construction of a free electron laser in accordance with a further embodiment of the present disclosure.

DETAILED DESCRIPTION OF EXEMPLARY EMBODIMENTS

Figure 1:
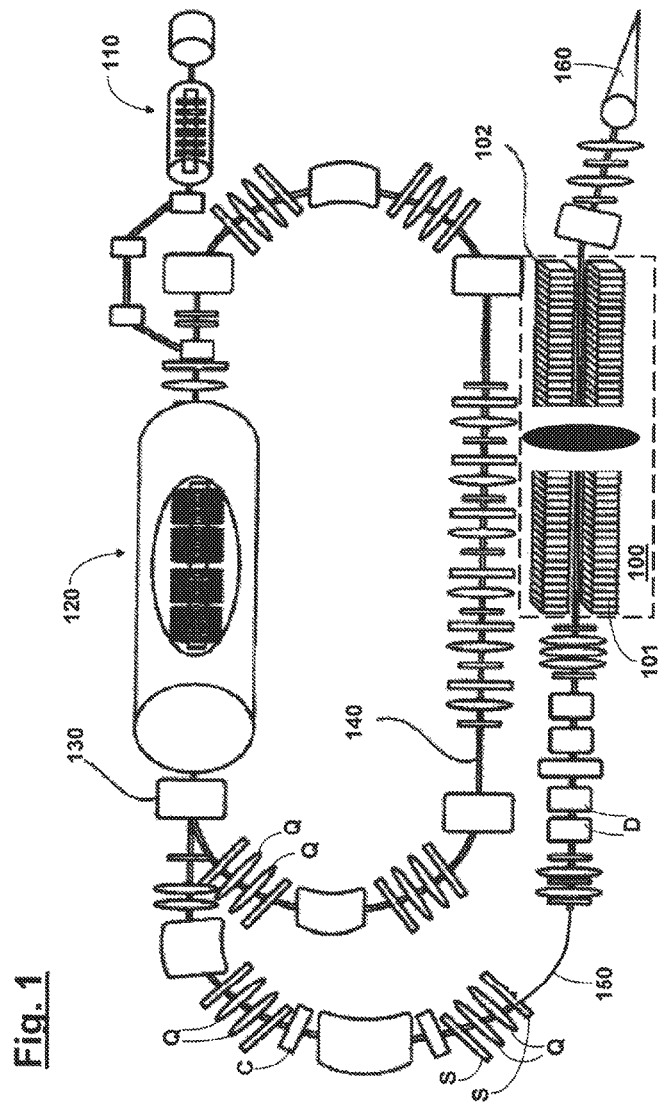
FIG. 1 shows a schematic illustration for elucidating the possible construction of a free electron laser according to the present disclosure.

FIG. 1 shows a schematic illustration for elucidating the possible construction of a free electron laser formed by the EUV light source according to the present disclosure.

In accordance with FIG. 1 in the case of such a free electron laser, an electron beam generated by an electron source 110 is accelerated to a relativistic velocity with the aid of an accelerator unit 120. A dipole magnet 130 directs the electrons depending on their energy onto a first electron beam path 140 or a second electron beam path 150, wherein a plurality of dipole magnets (designated in part by "D" by way of example in FIG. 1), quadrupole magnets (designated in part by "Q" by way of example in FIG. 1) and sextupole magnets (designated in part by "S" by way of example in FIG. 1) are respectively arranged on the electron beam paths 140, 150.

After passing once through the accelerator unit 120, the energy of the electrons in the electron beam is such that the electrons are directed onto the first electron beam path 140 by the dipole magnet designated by "130" and consequently pass through the accelerator unit 120 again, as a result of which the electrons are accelerated further. During the second pass of the dipole magnet 130, the energy of the electrons in the electron beam is such that they are directed onto the second electron beam path 150. Multiply passing through the accelerator unit 2 is also referred to as the recirculator concept and is described in detail in publication "Compact 13.5-nm free-electron laser for extreme ultraviolet lithography" by Y. Sokol, G. N. Kulipanov, A. N. Matveenko, O. A. Shevchenko and N. A. Vinokurov, Phys. Rev. Spec. Top., 14:040702, 2011. The disclosure is not, however, restricted to the recirculator concept, but rather can also be realized in a different configuration (without multiply passing through the accelerator unit).

The electrons directed into the second electron beam path 150 impinge on an undulator arrangement 100. The undulator arrangement 100 causes the electron beam to effect a sinusoidal periodic movement. On account of the deflection of the electrons, the electrons emit synchrotron radiation that is directed almost completely forward along the electron path owing to the relativistic movement of the electrons. Radiation emitted in adjacent periods of the undulator arrangement 100 can be superimposed with the correct phase. The wavelength of the free electron laser can be tuned here by varying the energy of the electrons, the period of the undulator arrangement 100 or the magnetic field of the undulator arrangement 100.

The EUV light generated by the undulator arrangement 100 is coupled into the illumination device of a projection exposure apparatus 160, which is merely indicated schematically in FIG. 1.

Figure 2:
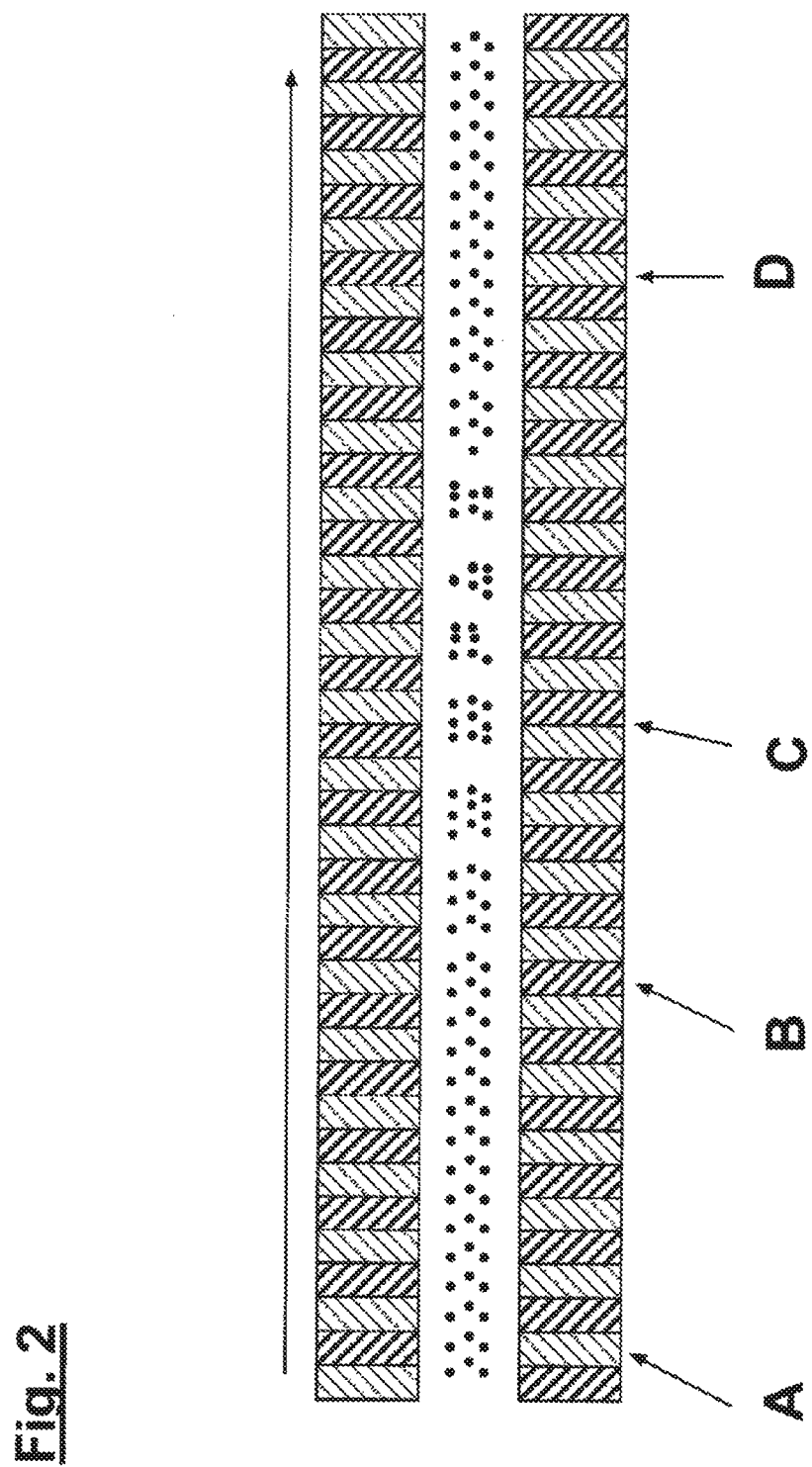
FIGS. 2-4 show schematic illustrations for elucidating the principle underlying the present disclosure.
Figure 3:
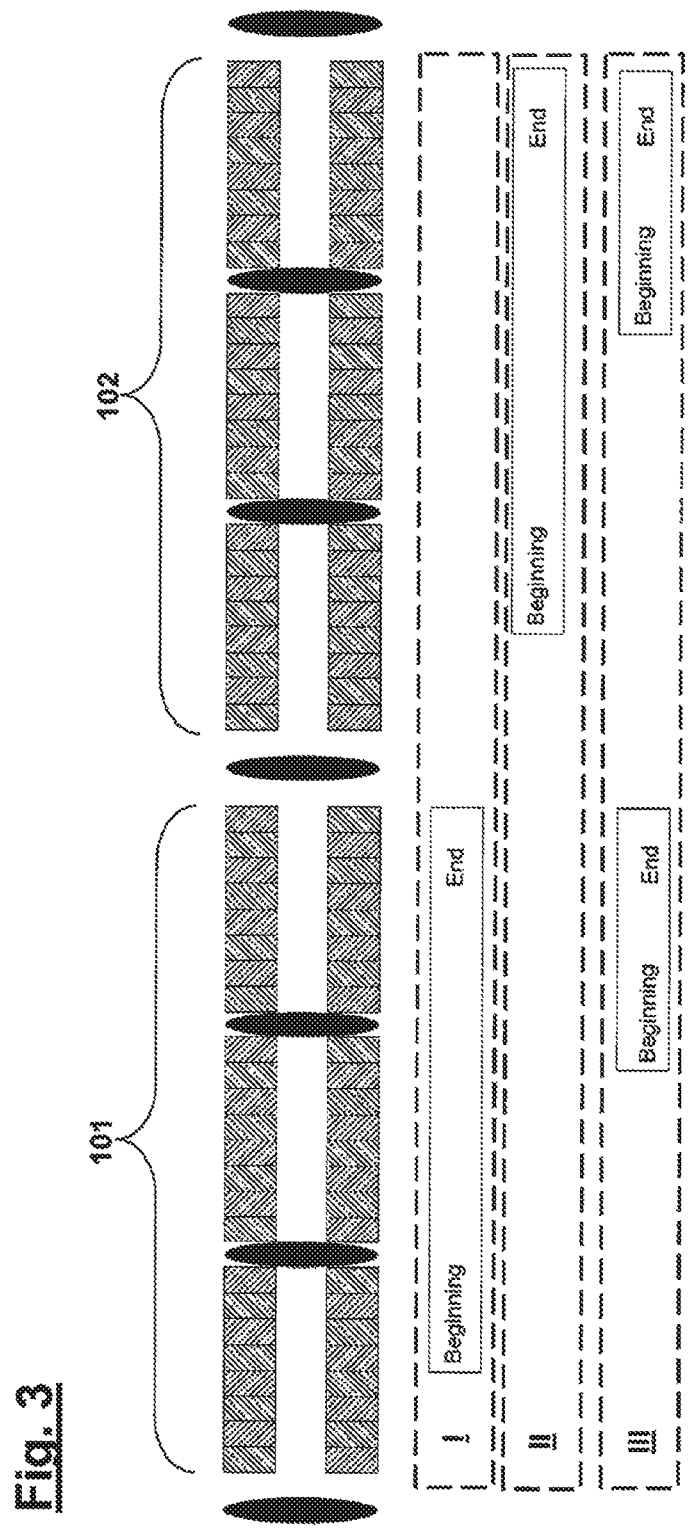

FIGS. 2 and 3 show schematic illustrations for elucidating the principle underlying the present disclosure.

As illustrated merely schematically in FIG. 2, when the electron beam passes through the undulator arrangement 100, from the initially homogeneously distributed electrons (section "A"), electron bunches (so-called "microbunches") of the order of magnitude of the wavelength (taking account of the Lorentz contraction on account of the relativistic velocity of the electrons) form (section "B") wherein only the electrons situated in one and the same electron bunch can emit mutually coherent radiation. The laser action accordingly begins as soon as the electron bunches or "microbunches" are sufficiently pronounced (section "C") and ends as soon as the energy dispersion of the electrons owing to the laser action and the associated energy loss and the accordingly increasing energy unsharpness has become too great or leads to a resolution of the electron bunches or "microbunches" (section "D").

In accordance with FIG. 3, then, the undulator arrangement 100 according to the disclosure includes a first undulator 101 and a second undulator 102, wherein the first and second undulators 101, 102 are configured with regard to their respective magnet arrangements such that the electromagnetic radiation respectively emitted by them has mutually different polarization states. In the concrete exemplary embodiment, for instance the first undulator 101 can be configured in such a way that the light emitted by it is polarized horizontally or in the x-direction, and the second undulator 102 can be configured in such a way that the light emitted by it is polarized vertically or in the y-direction.

Proceeding from this undulator arrangement 100, according to the disclosure it is now possible to realize a flexible variation of the respective absolute values of the two undulators 101, 102 with respect to the electromagnetic radiation generated overall, and thus a flexible setting of the polarization state ultimately generated, as will be explained below.

Figure 4:
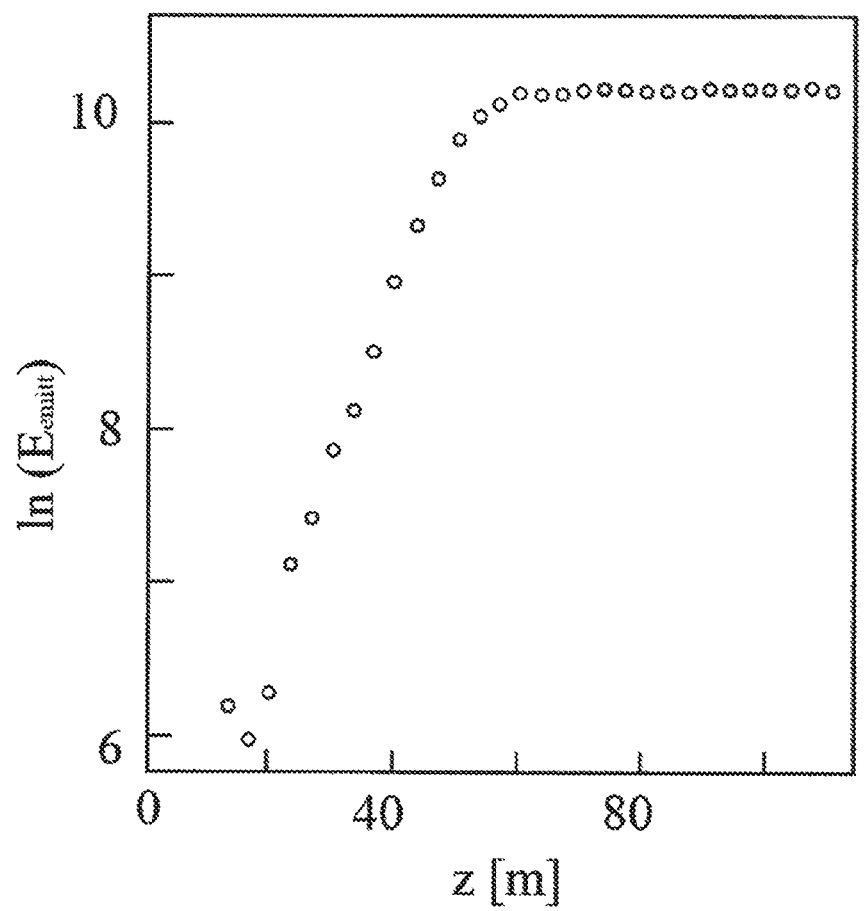

In principle, in an undulator with regard to the dependence of the emitted light intensity or energy on the propagation distance z before the onset of saturation, in accordance with FIG. 4, there occurs an exponential rise in the emitted light intensity or energy $E_{emitt}$ with the relationship $$I(z) = I_i \cdot e^{z/L_g} \tag{1}$$

wherein $L_g$ denotes the so-called gain length and $I_0$ denotes the light intensity at the input of the undulator.

In particular, in accordance with one embodiment of the disclosure for distributing the energy emitted overall between the two undulators 101, 102 (i.e. for varying the respective absolute values of the undulators 101, 102 with respect to the electromagnetic radiation generated overall) it is possible to vary the gain length $L_g$. This approach is based on the consideration that with a relatively short gain length the entire useable energy is already removed from the electron beam in the first undulator 101, wherein the energy unsharpness of the electrons is subsequently so great that laser action is no longer possible. By contrast, if the gain length is chosen to be relatively long, in the first undulator 101 light is generated or energy is removed from the electron beam to a comparatively small extent with the consequence that the laser action or light generation only takes place in the second undulator 102.

As indicated schematically in FIG. 3, in a first scenario "I", for example, both the start and the end of the laser action can take place on the part of the first undulator 101 in order that the entire radiation released by the undulator arrangement is horizontally polarized. In a second scenario "II" both the start and the end of the laser action can take place on the part of the second undulator 102 in order that the entire radiation released by the undulator arrangement is vertically polarized. In a third scenario "III" a laser action can respectively take place both on the part of the first undulator 101 and on the part of the second undulator 102 such that both horizontally polarized radiation and vertically polarized radiation are generated (in identical or else different proportions). In the latter case, the relevant, differently polarized rays can either be fed spatially separately to the illumination device (as described below with reference to FIG. 5 and FIG. 6), in order to generate a specific polarized illumination setting such as e.g. a quasi-tangentially polarized illumination setting, or else be superimposed on one another in order to generate unpolarized light.

One exemplary quantitative consideration shows that, owing to the exponential profile shown with reference to FIG. 4, a significant variation of the distribution of the energy emitted overall between the two undulators 101, 102 and thus of the polarization state ultimately provided can already be achieved with a relatively small change in the gain length.

In this respect, it is assumed below that the typical length of an undulator for attaining saturation starting only from the noise of the electron beam corresponds to 18 times the value of the gain length. If, proceeding from such a configuration of the undulators 101, 102 in which the entire light generation is effected by the first undulator 101, the gain length is increased by a factor of 1.2, for example, the length of the first undulator 101 is effectively only 18/(1.2)=15 gain lengths, such that the first undulator lacks three gain lengths up to attaining saturation with the consequence that the energy or intensity released by the first undulator is only approximately 5% of the maximum possible energy or intensity and the remaining approx. 95% is instead released by the second undulator 102.

The gain length $L_g$ is dependent both on the diameter of the electron beam generated by the electron source and on the energy dispersion which the electron beam already has. The variation of the gain length $L_g$ in order to vary the distribution of the energy emitted overall between the two undulators 101, 102 can therefore be effected in different ways, in principle, wherein a combination of different options is also possible:

In accordance with one option, the electric current applied to the quadrupole magnets Q—shown in the construction from FIG. 1—for focusing the electron beam can be varied in a targeted manner. That is based on the consideration that the constant focusing of the electron beam that is brought about by the quadrupole magnets Q counteracts a divergence of electrons of the electron beam, wherein the divergence of the electrons leads to larger angles between in each case a specific electron and the optical axis. The effect of this angle increase on the gain length can be described by the dimensionless parameter $$X_\varepsilon = \frac{L_{g0} \cdot 4\pi\varepsilon}{\beta_{av} \cdot \lambda_e} \quad (2)$$

which is explained in greater detail for example in P. Schmüser et al.: "Ultraviolet and Soft X-Ray Free-Electron Lasers: Introduction to Physical Principles, Experimental Results, Technological Challenges", STMP 229, Springer, Berlin Heidelberg 2008, DOI 10.1007/ 978-3-540-79572-8.

In equation (2) $\varepsilon$ is the "emittance" (i.e. the occupied phase space volume) of the electron beam, that is to say the product of the RMS in the position space and the RMS in the angle space. The extent in the position space is not specified directly in accelerator physics, but rather is specified as a product $\beta_{av}\varepsilon$ relative to the emittance. $\lambda_e$ the the wavelength of the emitted radiation. This results from the period $\lambda_u$ of the undulator by double Lorentz contraction, that is to say that in the rest system of the electrons the undulator moves relativistically, and the radiation emitted by the electrons has to be transformed into the laboratory system. $L_{g0}$ Is the gain length to a first approximation i.e. disregarding interaction effects and/or unsharpnesses in the position, angle and energy spaces. $L_{g0}$ thus acts, as expected, as a scaling factor for all relevant effects which can alter the gain length.

In other words the switching between a first operating mode in which the first undulator 101 is in saturation with regard to the generation of EUV light, and at least one second operating mode in which the first undulator 101 is not in saturation with regard to the generation of EUV light, and thus also the control of the polarization state of the radiation generated by the EUV light source can be realized at least partly by variation of the electric current applied to the quadrupole magnets Q.

In accordance with a further option, a variation of the gain length $L_g$ or a variation of the distribution of the energy emitted overall between the two undulators 101, 102 can also be effected by way of the energy unsharpness of the electrons generated by the electron source 110. Relative parameters for the energy unsharpness of electrons are firstly the (electron) temperature of the electrode and secondly the energy of the photons used to detach electrons. Furthermore, interactions among the electrons and additional electric fields in the deflection magnets can also lead to an increase in the energy unsharpness. The effect of an energy unsharpness on the gain length can be described by the dimensionless parameter $$X_\gamma = \frac{L_{g0} \cdot 4\pi\sigma_\eta}{\lambda_u}. \quad (3)$$

$\sigma_\eta$ quantifies the RMS of the energy fluctuations of the electrons in the electron beam.

FIG. 8 shows a schematic illustration for elucidating the possible construction of a free electron laser formed by the EUV light source according to the present disclosure in accordance with a further embodiment, wherein analogous or substantially functionally identical components in comparison with FIG. 1 are designated by reference numerals increased by "700". The construction in accordance with FIG. 8 differs from that from FIG. 1 in particular in that the undulators 801, 802 are not arranged one behind another along the direction of propagation of the electron beam, but rather parallel to one another, wherein an electron beam switch 870 (e.g. in the form of a drivable magnet) is situated in the electron beam path 850, via the driving of which electron beam switch the electron bunches can be directed selectively to the undulators 801, 802 of the undulator arrangement 800. In this case, both the EUV light generated by the first undulator 801 and the EUV light generated by the second undulator 802 are coupled into a projection exposure apparatus 860 (merely indicated schematically in FIG. 8) (i.e. in particular into one and the same illumination device). Consequently, in the construction in accordance with FIG. 8 as well the respective relative proportion in which the energy of the electron beam is converted into EUV light generated by the first undulator and respectively into EUV light generated by the second undulator is settable in a variable manner (wherein the undulators can generate mutually orthogonal polarization states e.g. in this embodiment as well). Here in the case of the construction in accordance with FIG. 8 as well, the relevant, differently polarized beams can either be fed spatially separately to the illumination device of the projection exposure apparatus 860 (as described below with reference to FIG. 5 and FIG. 6), in order to generate a specific polarized illumination setting such as e.g. a quasi-tangentially polarized illumination setting, or else be superimposed on one another in order to generate unpolarized light.

Consequently, in the case of the construction shown in FIG. 8 as well, with constant use of the entire radiation energy or intensity released by the undulator arrangement 800 according to the disclosure, by way of the variation of the relative contributions of the two undulators 801, 802 to this total intensity, it is possible to achieve the flexible setting of the polarization distribution without significant loss of light.

Figure 5:
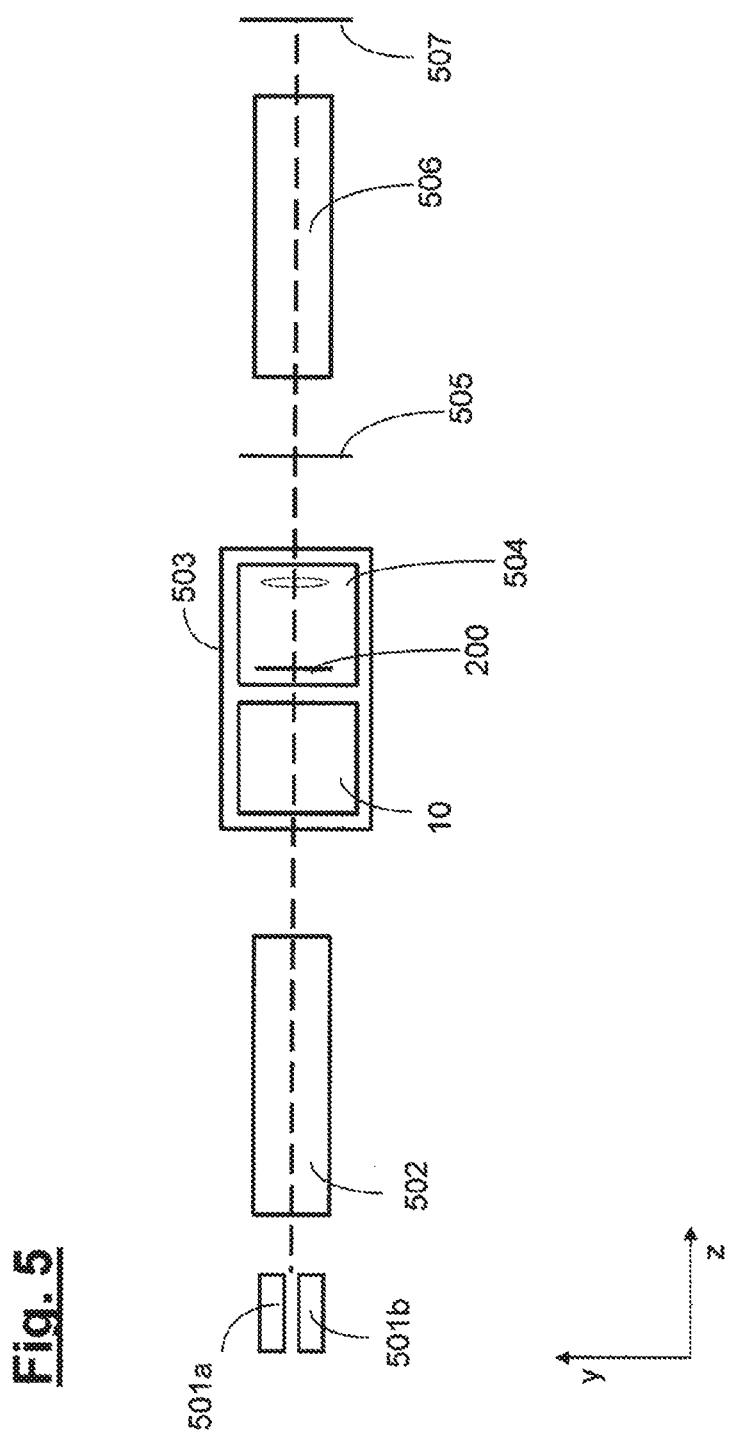
FIGS. 5-6 show schematic illustrations for elucidating the possible construction of a microlithographic projection exposure apparatus in which the present disclosure can be realized.
Figure 6:
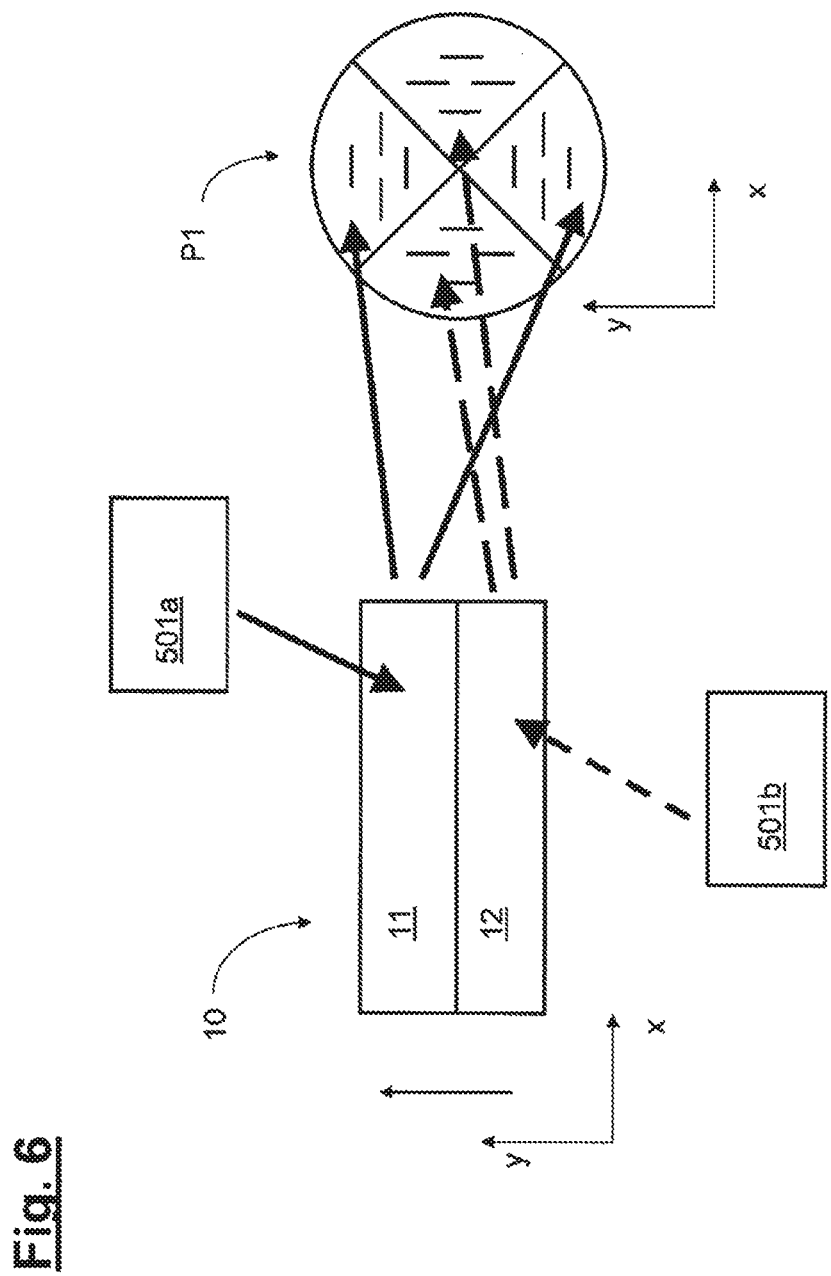

FIGS. 5-6 serve for merely schematic and simplified illustration of the possible construction of a microlithographic projection exposure apparatus in which the disclosure can be realized. In accordance with FIG. 5, light is coupled into an illumination device 503 via two inputs 501a, 501b (e.g. corresponding to the undulators 101, 102 described above) via an optical beam guiding and expanding unit 502, the illumination device including a beam deflecting arrangement 10 (as described below with reference to FIG. 6) and—in an optical unit 504 for pupil generation—a mirror arrangement 200 situated in an intermediate field plane. A mask (reticle) 505 illuminated by the illumination device 503 is situated in the object plane of a downstream projection lens 506, which images the structures on the mask 505 onto a wafer 507 arranged in the image plane.

In accordance with FIG. 6, the beam deflecting arrangement 10 can be embodied e.g. as a strip mirror unit, wherein "11" and "12" can represent two different strip mirrors or else groups of strip mirrors. The strip mirrors or first reflection surfaces 11, 12, . . . are tiltable in each case about two mutually perpendicular tilting axes (which run in the x- and y- directions in the exemplary embodiment), such that the light reflected at the strip mirrors or first reflection surfaces 11, 12, . . . can be reflected into different, in principle arbitrarily settable solid angles, depending on the tilting of the respective strip mirror. The light which is reflected at the individual reflection surfaces or strip mirrors of the beam deflecting arrangement 10 and which originates from either the first input 501a or the second input 501b and has a corresponding polarization state provided by the relevant undulator 101, 102 is directed via the abovementioned mirror arrangement 200 (not illustrated in FIG. 6) including a plurality of mirror elements adjustable independently of one another into a pupil plane (e.g. onto a pupil facet mirror situated in the pupil plane), in which a desired polarized illumination setting P1 is generated in accordance with the orientation of the first reflection surfaces of the beam deflecting arrangement 10 and of the mirror elements of the mirror arrangement. The desired polarized illumination setting, e.g. as indicated in FIG. 6—but without the disclosure being restricted thereto—can be an approximately tangentially polarized illumination setting (also referred to as quasi-tangentially polarized illumination setting) which enables a high-contrast imaging in a manner known per se, wherein the illumination poles situated opposite one another in the x-direction are linearly polarized in the y-direction and the illumination poles situated opposite one another in the y-direction are polarized in the x-direction. The polarization distribution generated can furthermore also be, for example, an at least approximately radial polarization distribution.

Even though the disclosure has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the appended patent claims and the equivalents thereof.

What is claimed is:

1. An EUV light source, comprising:
   an electron source configured to generate an electron beam;
   an accelerator unit configured to accelerate the electron beam; and
   an undulator arrangement configured to generate EUV light via deflection the electron beam, the undulator arrangement comprising:
   a first undulator configured to generate EUV light having a first polarization state; and
   a second undulator configured to generate EUV light having a second polarization state which is different from the first polarization state,
   wherein:
   the second undulator is downstream of the first undulator along a direction of propagation of the electron beam; and
   the undulator arrangement is configured so that:
   in a first operating mode, the first undulator is in saturation with respect to the generation of EUV light; and
   in a second operating mode different from the first operating mode, the first undulator is not in saturation with respect to the generation of EUV light.

2. The EUV light source of claim 1, wherein the undulator arrangement is configured so that in at least one operating mode of the undulator arrangement at least 90% of the generation of the EUV light is effected by the second undulator.

3. The EUV light source of claim 1, wherein the undulator arrangement is configured so that in at least one operating mode at least 90% of the generation of the EUV light is effected by the first undulator.

4. The EUV light source of claim 1, wherein the undulator arrangement is configured so that in at least one operating mode at least 40% of the generation of the EUV light is effected by the first undulator and at least 40% of the generation is effected by the second undulator.

5. The EUV light source of claim 1, wherein the polarization state of the EUV light generated by the undulator arrangement is variably settable via modification of the electron beam before the electron beam interacts with the undulator arrangement.

6. The EUV light source of claim 1, wherein the polarization state of the EUV light generated by the undulator arrangement is variably settable via modification of a gain length of the electron beam before the electron beam interacts with the undulator arrangement.

7. The EUV light source of claim 1, further comprising quadrupole magnets configured to focus the electron beam, wherein the quadrupole magnets are configured so that an electrical current is applicable to the quadrupole magnets, and switching between the first and second operating modes is at least partly effected via variation of the electric current in at least one of the quadrupole magnets.

8. The EUV light source of claim 1, wherein the first and second polarization states are orthogonal with respect to each other.

9. The EUV light source of claim 1, wherein the undulator arrangement is configured so that a first light beam generated by the first undulator and a second light beam generated by the second undulator are inputtable to an illumination device in a manner such that they are spatially separated from each other.

10. The EUV light source of claim 1, wherein the first and second undulators are arranged so that a direction of propagation of the electron beam in the first undulator is tilted relative to a direction of propagation of the electron beam in the second undulator.

11. The EUV light source as claimed of claim 1, wherein the undulator arrangement is configured that a first light beam generated by the first undulator is superimposable on a second light beam generated by the second undulator while the first and second light beams are input to an illumination device.

12. A method of EUV light source for an illumination device of a microlithographic projection exposure apparatus, comprising:
   using the EUV light source to generate EUV light,
   wherein the EUV light source is an EUV light source according to claim 1, and the method comprises switching between the first and second operating modes.

13. The method of claim 12, comprising switching between the first and second operating modes by modifying the electron beam before the electron beam interacts with the undulator arrangement.

14. The method of claim 12, wherein the EUV light source comprises a plurality of quadrupole magnets configured to focus the electron beam, and the method comprises applying electric current to the quadrupole magnets to at least partially effect switching between the first and second operating modes.

15. The method of claim 12, comprising generating a light distribution in a pupil plane of the illumination device, wherein the distribution is an approximate tangential polarization distribution or an approximately radial polarization distribution.

16. The method of claim 12, comprising generating unpolarized light is generated in a pupil plane of the illumination device.

17. An apparatus, comprising:
an EUV light source according to claim 1;
an illumination device; and
a projection lens,
wherein the apparatus is a microlithographic projection exposure apparatus.

18. A method of operating a microlithographic projection exposure apparatus comprising an EUV light source, an illumination device and a projection lens, the method comprising:
using the EUV light source to provide EUV light to the illumination device;
using the illumination device to illuminate structures of a reticle; and
using the projection lens to project illuminated structures of the reticle onto a light sensitive material,
wherein the EUV light source is an EUV light source according to claim 1.

19. An apparatus, comprising:
an EUV light source, comprising:
an electron source configured to generate an electron beam;
an accelerator unit configured to accelerate the electron beam; and an undulator arrangement configured to generate EUV light via deflection of the electron beam;
an illumination device; and
a projection lens,
wherein:
the undulator arrangement comprises:
a first undulator configured to generate EUV light having a first polarization state; and
a second undulator configured to generate EUV light having a second polarization state which is different from the first polarization state;
during the operation of the apparatus:
EUV light generated by the first undulator and EUV light generated by the second undulator are coupled into the illumination device; and
a proportion of the energy of the electron beam converted into EUV light generated by the first undulator relative to a proportion of the energy of the electron beam converted into EUV light generated by the second undulator variably settable; and
the apparatus is a microlithographic projection exposure apparatus.

20. The apparatus of claim 19, wherein undulator arrangement is configured so that the proportion of the energy of the electron beam converted into EUV light generated by the first undulator relative to a proportion of the energy of the electron beam converted into EUV light generated by the second undulator variably set via modification of the electron beam before the electron beam interacts with the undulator arrangement.

21. A method of EUV light source for an illumination device of a microlithographic projection exposure apparatus, comprising:
using the EUV light source to generate EUV light,
wherein the EUV light source is an EUV light source according to claim 19, and the method comprises switching between the first and second operating modes.

22. The method of claim 21, comprising modifying the electron beam before the electron beam interacts with the undulator arrangement to variably set the proportion of the energy of the electron beam converted into EUV light generated by the first undulator and the proportion of the energy of the electron beam converted into EUV light generated by the second undulator.

23. A method of operating a microlithographic projection exposure apparatus comprising an EUV light source, an illumination device and a projection lens, the method comprising:
using the EUV light source to provide EUV light to the illumination device;
using the illumination device to illuminate structures of a reticle; and
using the projection lens to project illuminated structures of the reticle onto a light sensitive material,
wherein the microlithographic projection exposure apparatus is a microlithographic projection exposure apparatus according to claim 19.

* * * * *

UNITED STATES PATENT AND TRADEMARK OFFICE
CERTIFICATE OF CORRECTION

PATENT NO. : 9,823,571 B2
APPLICATION NO. : 15/266191
DATED : November 21, 2017
INVENTOR(S) : Michael Patra It is certified that error appears in the above-identified patent and that said Letters Patent is hereby corrected as shown below:

On the Title Page

Column 2 (Abstract): Delete "proj ection" and insert -- projection --, therefor.

In the Specification

Column 1, Line 58: Delete "FIG." and insert -- FIGS. --, therefor.

Column 2, Line 1: Delete "7A,7B" and insert -- 7A, 7B --, therefor.

Column 8, Line 7 (approx.): Delete "$I(z)=I_i \cdot e^{z/Lg}$" and insert -- $I(z) = I_0 \cdot e^{z/Lg}$ --, therefor.

Column 9, Line 36: Delete "$\lambda_e$ the the" and insert -- $\lambda_e$ is the --, therefor.

Column 9, Line 41: Delete "Is" and insert -- is --, therefor.

Signed and Sealed this
Twenty-seventh Day of March, 2018

Andrei Iancu
*Director of the United States Patent and Trademark Office*